United States Patent [19]
Simpson et al.

[11] Patent Number: 4,546,260
[45] Date of Patent: Oct. 8, 1985

[54] ALIGNMENT TECHNIQUE

[75] Inventors: Robert A. Simpson, Wappingers Falls; Ralph R. Trotter, Hopewell Junction; Edward V. Weber, Poughkeepsie, all of N.Y.

[73] Assignee: International Business Machines Corporation, Armonk, N.Y.

[21] Appl. No.: 509,515

[22] Filed: Jun. 30, 1983

[51] Int. Cl.⁴ ............................................. H01J 37/00
[52] U.S. Cl. ......................... 250/491.1; 219/121 EW
[58] Field of Search .................. 250/491.1, 492.2, 358; 219/121 EV, 121 EW

[56] References Cited

U.S. PATENT DOCUMENTS

| | | | |
|---|---|---|---|
| 3,519,788 | 7/1970 | Hatzakis | 250/492.2 |
| 3,575,588 | 4/1971 | Hermann | 235/151.1 |
| 3,670,153 | 6/1972 | Rempert et al. | 235/151.11 |
| 3,876,883 | 4/1975 | Broers et al. | 250/492.2 |
| 3,924,113 | 12/1975 | Gill et al. | 235/181 |
| 3,955,072 | 5/1976 | Johannsmeier et al. | 235/151.11 |
| 4,052,603 | 10/1977 | Karlson | 364/120 |
| 4,103,998 | 8/1978 | Nakazawa et al. | 356/152 |
| 4,203,064 | 5/1980 | Suzuki et al. | 318/640 |
| 4,209,830 | 6/1980 | Arimura et al. | 364/490 |
| 4,238,780 | 12/1980 | Doemens | 340/146.3 H |
| 4,301,470 | 11/1981 | Pagany | 358/101 |
| 4,357,540 | 11/1982 | Benjamin et al. | 250/491.1 |
| 4,365,163 | 12/1982 | Davis et al. | 250/491.1 |
| 4,370,554 | 1/1983 | Bohlen | 250/491.1 |

OTHER PUBLICATIONS

"Registration Mark Detection for Electron-Beam Lithography-EL1 System", Davis, *IBM J. Res. Dev.* vol. 24, No. 5, Sep. 1980.
"Automatic Registration in an Electron-Beam Lithographic System", Davis et al., *IBM J. Res. Develop.*, Nov. 77, pp. 498–505.
"Correction of Nonlinear Deflection Distortion in a Direct Exposure Electron-Beam System" Engelke et al., *IBM J. Res. Develop.* Nov. 1977, pp. 506–513.

*Primary Examiner*—Bruce C. Anderson
*Attorney, Agent, or Firm*—Sughrue, Mion, Zinn, Macpeak and Seas

[57] ABSTRACT

An alignment system for registration of a scanning beam in a mask inspection tool. Minimum scan widths (W) in the registration process are attained thereby increasing registration sensitivity. This technique allows initial placement of the E-Beam to be outside the capture range so that the scan on one side is completely off the metal (on glass) and the scan on the other side is completely on the metal. Correction signals are obtained by comparing the backscattered electron signals from the two scans with the magnitude of the signal being indicative of the amount of correction required and the sign being indicative of the direction of correction.

11 Claims, 7 Drawing Figures

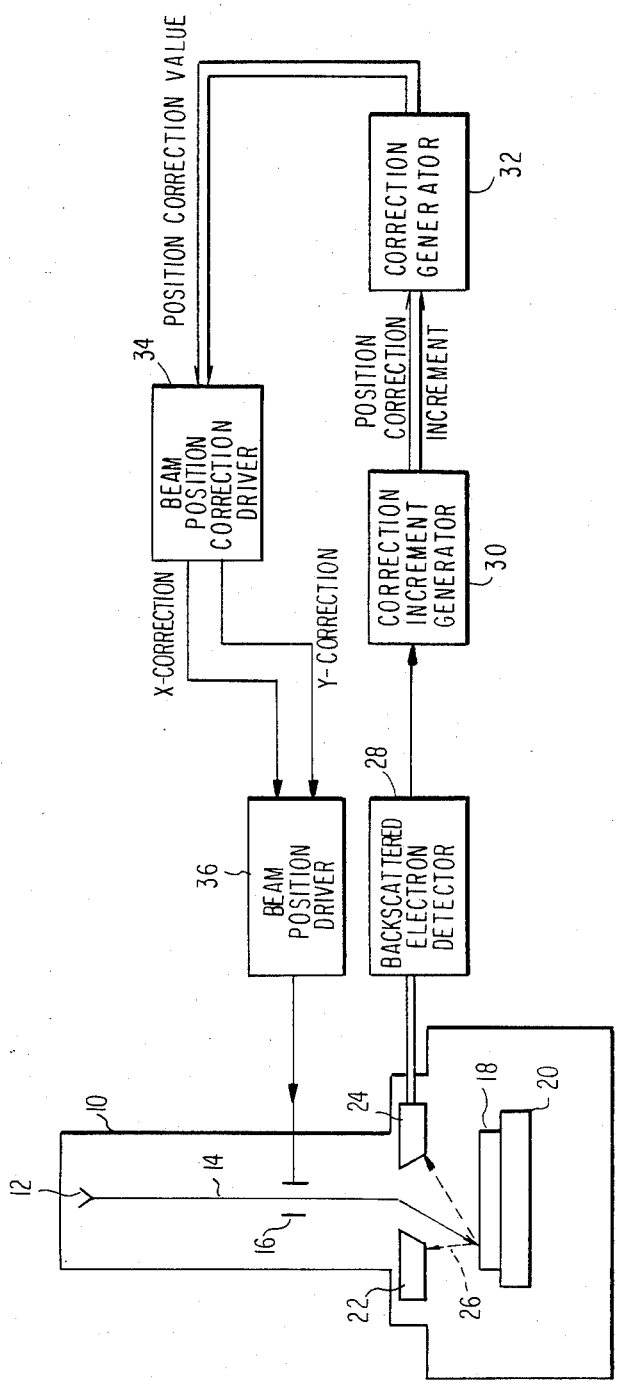

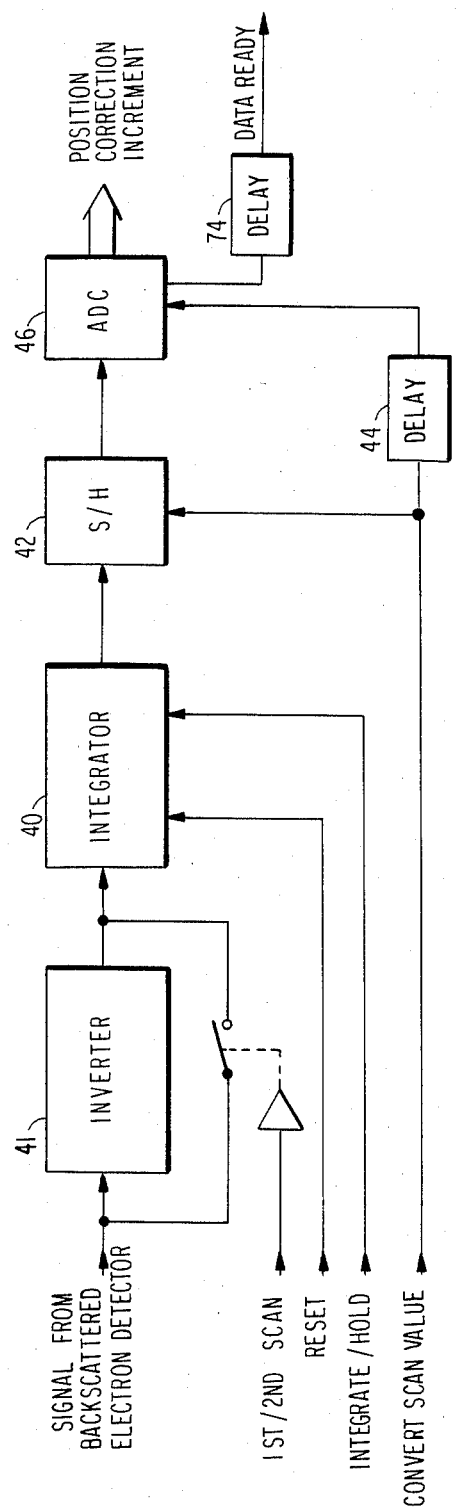
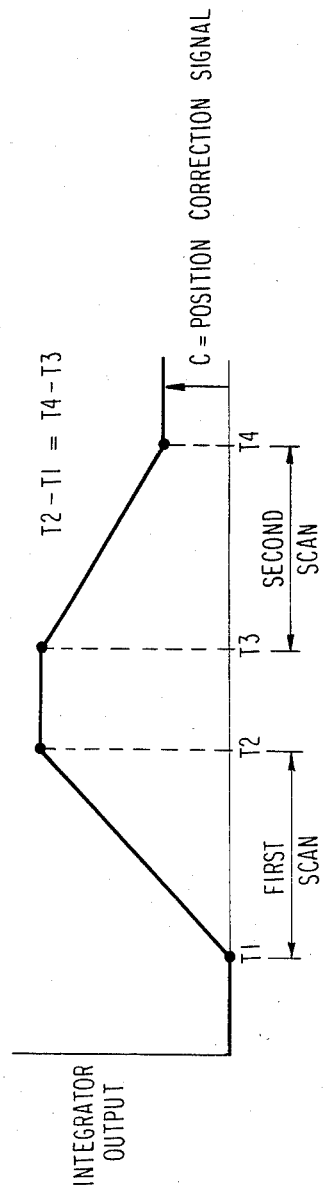
FIG. 4A CORRECTION INCREMENT GENERATOR
FIG. 4B

ALIGNMENT TECHNIQUE

BACKBROUND OF THE INVENTION

I. Field of the Invention

This invention relates to an automatic beam alignment system for testing, measurement, and verification of high contrast image patterns.

II. Prior Art

Registration is required to correct for a lack of overlay between a scanning beam and target features. This misalignment results from target fabrication and beam deflection tolerances. Tolerances for each are small over short distances but are significant over the deflection range of the inspection tool. Known registration techniques may employ the measurement of either transmitted or reflected light, reflected or secondary electrons, or backscattered currents when a controllable beam is selectively addressed onto the unit to be inspected with controlled alignment. Reference is made to "Registration Mark Detection For Electron Beam Lithography-EL-1 Systems", Davis, IBM, J. Res. Dev. Vol. 24 No. 5, pp. 545–553, September 1980. Davis examines various techniques of automatic wafer registration in E-beam lithography. This is used to locate differences in surface topology as distinguished from differences in materials.

The difference between integrated signals resulting from scanning equal areas straddling opposite sides of features is a correction signal having a polarity related to the direction and an amplitude proportional to the magnitude of the beam to feature translation error.

Reference is made to U.S. Pat. Nos. 4,357,540 and 4,365,163. These patents disclose a registration scheme utilizing a scanning beam system for mask inspection by scanning regions straddling opposite edges of features on the substrate to be inspected.

Prior art relating to alignment techniques utilizes different approaches. For example, U.S. Pat. Nos. 4,301,370; 4,238,780; 4,209,830; and 4,203,064 all relate to techniques for aligning integrated circuit chips for purposes of bonding. U.S. Pat. No. 3,670,153 relates to a technique for aligning substrates prior to applying the chips for bonding. U.S. Pat. No. 3,924,113 relates to a technique of aligning an electron beam scanned field to a wafer.

The above-described patents require a large scan window to provide the capture range needed to ensure alignment over the range of tolerances affecting the pre-alignment positioning of the object to be aligned. If the features are not contained within the scanned windows, it is not possible to generate a valid correction. Therefore, alignment accuracy cannot be increased by reducing the scanned window size. These prior art techniques therefore cannot handle an out of range condition where a piece lays outside the respective scan windows.

U.S. Pat. Nos. 3,955,072; 4,052,603; and 4,103,998 relate to optical mask to wafer alignment techniques. U.S. Pat. No. 3,876,883 relates to a system for aligning a mask to a wafer in a electron beam projection system. These prior art devices determine the relationship of superimposed images of pairs of known features on two objects, that is the mask and wafer, to provide mutual alignment. No attempt is made in these systems to align the objects to a scanning beam. Finally, U.S. Pat. No. 3,575,588 describes a technique for writing wiring patterns on substrates with an electron beam. In accordance with this patent the amount of data required for control of the beam sweep and deflection is reduced. Alignment is not a part of this technology.

Known registration techniques therefore commence by scanning features and generating a correction value which is then applied. In accordance with known technology registration sensitivity is inversely proportional to the width (W) of the areas scanned for registration, i.e. scan windows. Consequently, minimizing the value of W is an important criteria in any system. The minimum value of W is determined by the capture range required to insure registration over the range of the mask and the electron beam deflection tolerances. As such, $W \geq 2C$.

Another deficiency in these systems is the requirement for utilizing registration marks to reduce the subfield registration capture range to a reasonable value when mask tolerances approach several tenths of a micron. This is especially true in the case of optically generated photo masks. Use of a chip registration mark impacts system throughput by approximately 10% and requires that regions of product area be set aside for registration marks at each chip site. There is no capability for handling the occasional out of range condition which will inevitably occur. In these systems the best that can be done is to apply the maximum correction (W/2) with the hope that it also proves to be sufficiently accurate. These techniques are also sensitive to backscatter current variations primarily because of mask material thickness tolerances. This results in correction errors which are proportional to the correction needed. Such errors are significant when the maximum correction is needed unless some correction technique is employed.

SUMMARY OF THE INVENTION

Given the shortcomings in the prior art, it is an object of the present invention to define a registration system that allows initial placement of the scanning beam to be outside the capture range so that the scan window on one side is directed completely onto one material (high contrast) while the scan window on the other side is completely on a different material (low contrast).

Yet another object of this invention is to define a system of registration which eliminates the effect of backscattered current variations.

These and other objects of this invention are accomplished by a registration system wherein a beam is scanned over equal areas at nominal locations on opposite sides of patterns in a given field on a substrate. Different signal levels are obtained when scanning high contrast versus low contrast areas.

While scanning such that the beam straddles the edge of a feature, the detector output signal will approach the high contrast signal level as more and more of the electron beam impinges on the high contrast area of the target. Conversely, the signal will approach the low contrast signal level as more of the beam impinges on the low contrast area. The difference between the signal levels obtained by integrating these signals produced while scanning equal areas straddling opposite sides of a feature, has a magnitude proportional to the beam to pattern alignment error, and a sign that corresponds to the direction of this overlay error.

The present invention allows the use of minimum width (W) scan windows in the registration process to increase registration sensitivity. Prior art techniques have utilized a window width which is limited by a capture range (C) such that W≧2C. In accordance with the present invention however, initial placement of the beam may be outside the capture range, such that the scan on one side is completely off the high contrast material, while the scan on the other side is completely on the low contrast material, such that a maximum correction signal is obtained.

This invention will be described in greater detail by referring to the attached drawings and the description of the preferred embodiment of mask inspection with a shaped spot electron beam which follows.

BRIEF DESCRIPTION OF THE DRAWING

FIG. 3 is a block diagram of a system incorporating the successive positioning registration technique in accordance with the present invention;

FIG. 4A is a block diagram showing the correction increment generator of FIG. 3;

FIG. 4B is a graph plotting integrator output as a junction of time;

DESCRIPTION OF THE PREFERRED EMBODIMENT

Figure 1:
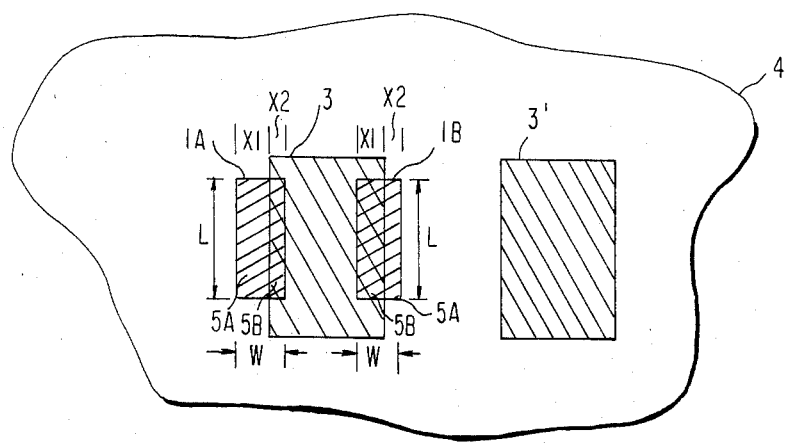
FIG. 1 is a schematic drawing showing registration scan areas on a specimen.
Figure 2:
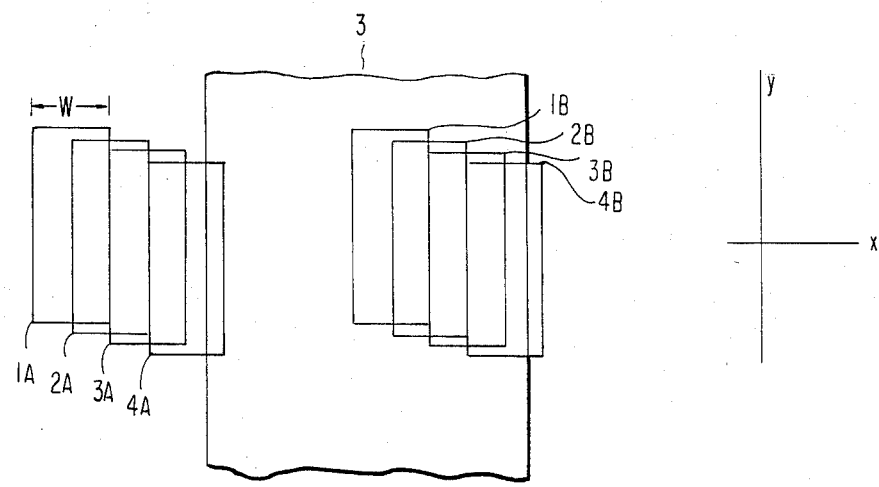
FIG. 2 is a schematic drawing illustrating a successive beam scan positioning.

Referring now to FIGS. 1 and 2, schematic drawings depict the basic registration technique in accordance with this invention. As shown in FIG. 1, the basic concept as employed by the present invention is that a shaped beam spot scans over equal areas illustrated as windows 1A and 1B at nominal locations straddling opposite sides of a metal feature 3 in a given field on a conductive coated glass substrate 4. FIG. 1 shows in schematic form metalization features 3 and 3'.

Different numbers of electrons will be back-scattered from the glass areas 4 and the metal areas 3 and 3'. The difference between the signal levels obtained by integrating the signals produced from the backscattered electrons, while scanning each of the windows (1A and 1B), has a magnitude that is proportional to the beam to pattern error (overlay) and a sign which corresponds to the direction of the overlay error.

The present invention departs from the prior art identified herein by eliminating the problem of accuracy loss with large capture range increase, minimizes the effects of unwanted target backscatter variation, and handles the condition where the scans do not straddle feature edges. As shown in FIG. 1 two areas 1A and 1B are scanned and a correction is determined based upon the difference in backscatter from the two areas. The correction is added to the net result of the corrections which were applied during scanning, to form a new correction. If rescanning, repeating the field registration scan sequence, is performed, the resulting correction corresponds to the error in application of the previous correction. Therefore, it will be significantly smaller. This technique allows for registration even if the scans do not straddle feature edges on the first pass. The system allows for successive updates to the beam position until acceptable alignment has been achieved. FIG. 2 illustrates successive pairs (A,B) of scan windows (1-4) which are shown slightly shifted in the y axis for clarity. Position corrections are made in the (X) direction.

As shown in FIG. 2 the first scan window pair (1A,1B) is mispositioned so that the feature edges are completely missed. That is, as shown in FIG. 2, a window of width (W) does not in any way overlap the edges of metal feature 3. This results in a maximum position correction increment equivalent to half the window width (W/2) being applied to the beam. It also results in a signal defined as Correction Increment Exceeds Limit being sent to a digital controller to automatically initiate a rescan at the updated position. Such will be defined herein relative to FIGS. 3-6. The example of FIG. 2 illustrates the scan windows overlapping the feature edges after 3 position updates that is, windows (4A, 4B). Final alignment is achieved by the less than maximum (W/2) position correction increment being applied after the fourth scan. It is noted that if another scan sequence occurred the scan windows would be symmetrically positioned relative to the feature edges.

Given this iterative technique it is possible to specify a maximum allowable incremental correction which is small enough so errors caused by back-scattered current variations will be acceptable. Should the limit be exceeded a rescan is performed. This technique also accommodates errors beyond the normal capture range since a correction signal equal to the capture range would be applied. Thus, on some subsequent rescan, the scan windows would be positioned within the capture range. Registration sensitivity can be as good as needed because this technique allows the use of a small window width (W) and the correction range is independent of the capture range. Rescanning can be completely automated utilizing the Correction Increment Exceeds Limit comparator output signal to cause the control hardware to repeat the registration scan sequence when a correction increment that is at or near the maximum is applied.

FIG. 3 shows an example of a registration system utilizing this iterative technique. FIG. 3 illustrates in highly schematic form an E-beam column 10 having an E-beam source 12 emitting a scanning beam 14 through various deflection plates 16. The beam 14 is steered as shown in FIG. 3 onto a sample 18 positioned on an X-Y table 20 within the evacuated E-beam column. Such E-beam generation, deflection and scanning techniques are well known in the technology.

As shown in FIG. 3 backscattered electron sensors 22 are positioned above the sample 18 to receive and sense backscattered electrons 26 emitted as a result of E-beam impingement onto the sample 18. A signal from sensors 22 is supplied to a backscattered electron detector 28 which is used to provide an input to the correction increment generator 30. The correction increment generator 30 integrates the signal during each pair of scans and digitizes the resulting value. The correction increment generator 30 produces an output representing the difference of the value received by the correction increment generator for each of the scans. This output is a position correction increment. The value is used as an input to the correction generator 32 which adds the increment to the existing position correction value thereby generating an updated position correction value used as an input to the beam position correction driver 34.

The beam position correction driver 34 converts the position correction value received from the correction generator 32 into an analog signal. This analog correction signal is supplied to the beam position driver 36 which is used to reposition the beam via a control input to steering plates 16.

Referring now to FIG. 4A, a block diagram of the correction increment generator 30 in FIG. 3 is shown. The signal from the backscattered electron detector 28 provides input to the integrator 40, either directly or through the inverter 41. The inverter 41 is used during the first scan (T1 to T2) for example, and bypassed during the second scan (T3 to T4) by using switch 44 actuated by a 1st/2nd scan control signal. Integrator 40 has its operation controlled by a Reset signal and an Integrate/Hold signal from the digital controller (not shown). The reset line is employed to zero the integrator. The integrate/hold line enables integration to occur when a feature edge is being scanned or causes the integrated signal to be held until after the sample and hold (S/H) module 42 is set to hold.

As an example, during scanning of window 1B, the 1st/2nd Scan signal causes the input signal to go through the integrator, and the Integrate/Hold signal causes the input signal to be integrated for a fixed time ($T=T2-T1$). During scanning of window 1A, the 1st/2nd Scan signal causes the input signal to bypass the integrator and the Integrate/Hold signal causes the input signal to be integrated for the same fixed amount of time ($T=T4-T3$). This is shown in FIG. 4B which plots integrator output as a function of time.

Upon completion of the scans, the system controller uses the Convert Scan Value signal line to set the sample and hold module 42 to a hold mode. After processing the Convert Scan Value signal through a delay module 44, a signal is provided to the analog to digital converter 46 to convert the analog input level received from the sample and hold module 42 into an equivalent digital value. When the A/D converter 46 completes the conversion it outputs the digitized position correction increment, which is used as an input to a correction generator 32, and a Data Ready signal.

Figure 5:
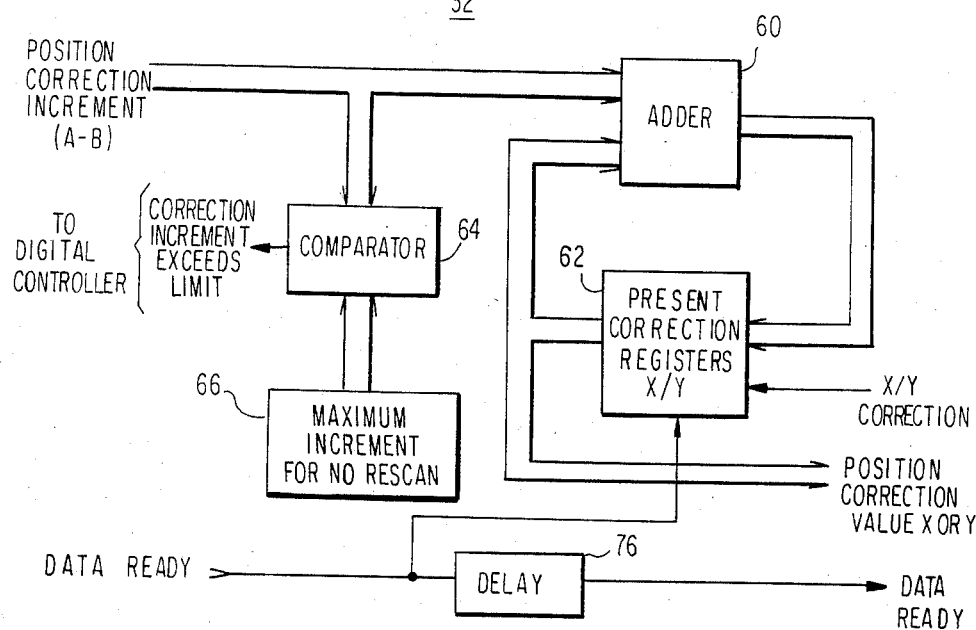
FIG. 5 is a block diagram showing the correction generator of FIG. 3.

Referring to FIG. 5, a block diagram of the correction generator is shown. A first input to the correction generator is the position correction increment signal. The correction generator accepts this position correction increment value as an input and adds it to the present correction value thereby generating an output which is the updated position correction value sent to a beam position correction driver.

Thus, as shown in FIG. 5 the correction generator utilizes an adder 60 receiving the position correction increment signal as one input. A present correction register 62 holds the present correction value which is used to form a second input to the adder. The adder then combines the present correction signal with the position correction increment to provide a new corrective value which is used to update register 62. This updated output, the new position correction value, is used as the output of the correction generator forming an input to the beam position correction driver.

As shown in FIG. 5 the position correction increment is also fed to a comparator 64 receiving as a second input a "Maximum Increment for No Rescan" signal 66. The two values are compared in the comparator 64. If the correction increment exceeds the predetermined allowed limit, a signal is returned to the digital controller. This signal from the comparator will then cause the registration scanning to be repeated.

Figure 6:
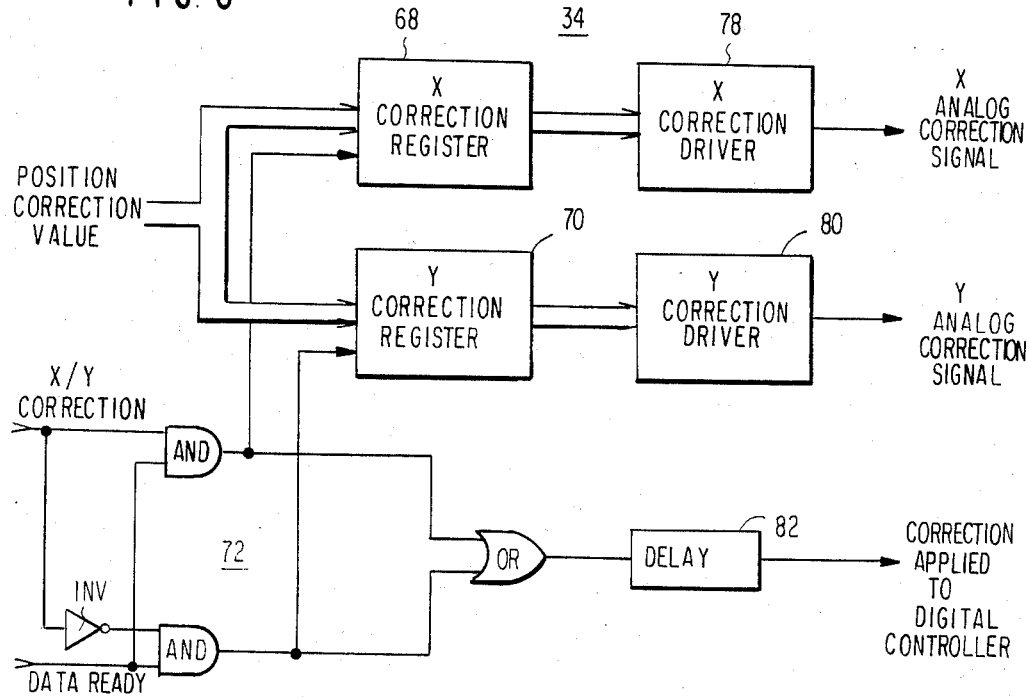
FIG. 6 is a block diagram showing the beam position correction driver of FIG. 3.

Referring now to FIG. 6, the block diagram of the beam position correction driver 34 is illustrated. The position correction value output from the present correction register 62 is used to form parallel inputs to a pair of correction registers, an X correction register 68 and a Y correction register 70. The value is strobed into one or the other of the registers 68 and 70, depending on the state of the X/Y correction line input to logic 72. That logic network receives as a second signal a data ready signal supplied from the correction increment generator shown in FIG. 4 as an output from delay 74 as further processed from the correction generator in a subsequent delay module 76. Thus, the ultimate data ready signal into logic network 72 provides a second input to the pair of AND gates such that the position correction value is strobed into either of the correction registers 68 or 70 at the proper time.

The values in the X register 68 and the Y register 70 are continuously inputted to a pair of digital/analog converters 78, 80. The output of those converters are analog X and Y correction signals sent to the beam position driver 36. The beam position driver 36 adjusts beam position in accordance with known techniques. When either correction driver is updated, a correction applied signal is sent to the digital controller as a function of the output of the OR gate in logic network 72 is processed through delay circuitry 82.

Thus, in accordance with the present invention a registration technique is provided having the ability to handle out of range registration conditions while enabling a maximum of registration sensitivity. This is accomplished by utilizing smaller width scans since the capture range is independent of correction range. The system also eliminates the need for precise pre-alignment.

Importantly, the present invention eliminates registration correction errors which are caused by backscattered current variations since it utilizes successive correction increments.

As set forth herein, the correction generator 32 allows, by comparison control, the registration scan to be repeated thereby controlling the correction error for successive samples, for example those of significantly varying material tolerances. Such is an important specific advance in this technology. The technique when employed for such samples will now be discussed.

Consider again FIG. 1 and the scanned area divided such that the scan W is divided into portion $X_1$ and $X_2$. Also, let $S_A$ equal the signal/unit area in the clear, that is, the glass, region and $S_B$ be the signal/unit area in the opaque or metal region. Thus, the signal received from scan area 1A would equal:

$$X_1 L S_A + X_2 L S_B$$

Correspondingly, the signal from the right hand scan area 1B would equal:

$$X_1 L S_B + X_2 L S_A$$

The translation error of the pair of scanned windows with respect to the feature is therefore related to the signal (S) obtained by taking the difference between the integrated signals obtained while scanning the right and left scan areas 1A and 1B. The difference signals can then be defined as:

$$S' = (X_2 L S_A + X_1 L S_B) - (X_2 L S_B + X_1 L S_A)$$
$$= X_2 L (S_A - S_B) + X_1 L (S_B - S_A)$$
$$= (X_2 - X_1) L (S_A - S_B)$$

For a given situation, the scan length L is fixed. For repeatable uniform coatings, the clear and opaque back-scattered signal levels/unit area, $S_A$ and $S_B$ are constant so that their difference $(S_A - S_B)$ will also be constant. Then, $$S = K(X_2 - X_1) = K\Delta X$$

where, $K = L(S_A - S_B)$ = constant and $\Delta X$ = the beam (scan window pair) to feature mispositioning.

Thus, the difference signal is proportional to the beam to pattern alignment difference, so that the signal can be used to correct the beam to pattern alignment.

However, variations in material thickness will affect the signal levels from the opaque ($S_B$) area primarily and conductive coated clear regions ($S_A$) on a mask. This effect will be minimized and may be made negligible by maintaining tight tolerances on material variation from plate to plate and within a plate.

Assuming the material tolerances between plates or over a plate result in a signal range $S_A' - S_B'$ that is $\beta$ times that of the nominal case the correction signal $S'$ becomes:

$$S' = (X_2 - X_1) L (S_A' - S_B')$$
$$= (X_2 - X_1) L \beta (S_A - S_B)$$
$$= \beta S$$

and $\Delta S'$, the error in the correction signal is:

$$\Delta S = S' - S$$
$$= (\beta - 1)S$$

which makes the correction error proportional to the correction.

The position error can be kept small by keeping the final correction increment small. For example, if $\beta = 1.1$ (10% increase in the signal difference) the correction will be in error by 10%. Then, the correction error may be maintained below a specific value by keeping the final correction increment below 10 times that correction error limit. A graph can therefore be complied of correction versus correction signal. Such a graph, not shown would plot the correction error as a function of the position correction for various $\beta$ values. Consequently, if $\beta = 1$ is the error free case, $\beta = 1.1$ would imply a signal difference 10% higher than the nominal. Consequently, a correction error limit may be maintained at, for example, $\pm 0.025$ μm, which limits the final position correction to a range $\pm 0.25$ μm for a 10% change in the signal difference. ($\beta = 1.1$ or 0.9) and to the range $\pm 0.5$ μm for a 5% variation in the signals difference.

Limiting the final correction increment is accomplished utilizing a comparator 64 shown in FIG. 5 that signals the digital controller when the position correction value exceeds the value in which the position error limit would be exceeded. The position is updated and the feature is rescanned until the correction increment is acceptable.

Thus, in accordance with the present invention an alignment system for registration of a scanning beam utilizing backscattered electrons in a mask inspection tool is defined having improved characteristics. The system allows the use of minimum scan widths in a registration process to thereby significantly increase registration sensitivity. Although the system has been defined relative to its preferred embodiment, it is apparent that light or other beams may be used, and other modifications may be practiced, without departing from the essential scope of this invention.

We claim:

1. A system of aligning a scanning beam to a pattern comprising:
   sensor means for generating signals during scans of separate portions of a pattern;
   processing means receiving said signals and producing a position correction increment signal having a sign and a magnitude indicative of the direction and the amount of misposition of said beam relative to said separate portions of said pattern; and
   means receiving said position correction increment signal and combining it with the correction which was applied during said scans to produce a correction signal having a magnitude indicative of the amount of required beam correction and a sign indicative of the required direction of correction.

2. The system of claim 1 further comprising a beam position correction driver receiving said correction signal and providing outputs for repositioning said scanning beam for a subsequent scan of said pattern.

3. The system of claim 2 further comprising an E-beam source and an evacuation column, a table positioned in said column, a sample having said pattern positioned on said table, said sensor means positioned in said column outside the scan range of said E-beam to receive backscattered electrons from said pattern, and a beam position driver with associated means in said column receiving the outputs from said beam position correction driver for repositioning said scanning beam.

4. The system of claim 1 wherein said processing means comprises signal converting means for converting error signals from said sensor means into a digitized output, means for storing the digitized output, and timing means for selectively gating said digitized output as a function of the scan rate of said scanning beam.

5. The system of claim 4 wherein said signal converting means comprises an integrator receiving said error signals, a buffer receiving the output of said integrator and an analog to digital converter operative to receive the output of said buffer as a function of said timing means.

6. The system of claim 1 further comprising a correction generator having a position register storing a signal indicative of the scanning position of said scanning beam, an adder receiving the output of said position register and said correction signal and producing as an input to said position register an updated position correction signal representing a new scanning position of said scanning beam.

7. The system of claim 6 further comprising means for storing a limit signal representing a maximum correction increment for no rescan, and comparator means receiving said limit signal and said maximum correction signal and producing an output if said correction increment signal exceeds said limit signal whereby said scan will be repeated.

8. The system of claim 2 wherein said correction driver comprises a pair of correction registers, timing means for directing the storing of said correction signal in either one of said correction registers and converter means for converting the signals stored in said correction register into an analog output for repositioning said scanning beam.

9. The system of claim 8 wherein one of said correction registers stores an X-direction correction signal and the other of said correction registers stores a Y-direction correction signal.

10. The system of claim 1 further comprising means for storing a limit signal representing a maximum correction increment for no rescan, and comparator means receiving said limit signal and said maximum correction signal and producing an output if said correction increment signal exceeds said limit signal whereby said scan will be repeated.

11. The system of claim 6 wherein said position register comprises a pair of registers, one storing an X-direction signal indicative of the scanning position of said scanning beam, and a second register storing a Y-direction signal indicative of the scanning position of said scanning beam.

* * * * *